(12) United States Patent
Kawase et al.

(10) Patent No.: US 12,048,087 B2
(45) Date of Patent: Jul. 23, 2024

(54) WIRING BOARD

(71) Applicant: KYOCERA Corporation, Kyoto (JP)

(72) Inventors: Aki Kawase, Kyoto (JP); Makoto Shiroshita, Otsu (JP)

(73) Assignee: KYOCERA CORPORATION, Kyoto (JP)

( * ) Notice: Subject to any disclaimer, the term of this patent is extended or adjusted under 35 U.S.C. 154(b) by 114 days.

(21) Appl. No.: 17/795,448

(22) PCT Filed: Dec. 8, 2020

(86) PCT No.: PCT/JP2020/045635
§ 371 (c)(1),
(2) Date: Jul. 26, 2022

(87) PCT Pub. No.: WO2021/153016
PCT Pub. Date: Aug. 5, 2021

(65) Prior Publication Data
US 2023/0088233 A1    Mar. 23, 2023

(30) Foreign Application Priority Data

Jan. 30, 2020 (JP) .................................. 2020-013257

(51) Int. Cl.
*H05K 1/02* (2006.01)
(52) U.S. Cl.
CPC .................... *H05K 1/0218* (2013.01)
(58) Field of Classification Search
CPC ................................................ H05K 1/0218
USPC ........................................................ 174/251
See application file for complete search history.

(56) References Cited

U.S. PATENT DOCUMENTS

| | | | |
|---|---|---|---|
| 8,163,642 B1 | 4/2012 | Wang | |
| 9,549,467 B1 | 1/2017 | Petrick et al. | |
| 2007/0263364 A1* | 11/2007 | Kawabe | H05K 1/0231 257/E23.079 |
| 2014/0321071 A1 | 10/2014 | Kim et al. | |
| 2016/0020163 A1* | 1/2016 | Shimizu | H05K 1/115 361/768 |

(Continued)

FOREIGN PATENT DOCUMENTS

| | | | |
|---|---|---|---|
| JP | 2005167140 A | * | 6/2005 |
| JP | 2010-153520 A | | 7/2010 |

(Continued)

*Primary Examiner* — Andargie M Aychillhum
(74) *Attorney, Agent, or Firm* — Volpe Koenig III

(57) ABSTRACT

A wiring board according to the present disclosure includes a core insulating layer, a first laminated body located on an upper surface of the core insulating layer, and a second laminated body located on a lower surface of the core insulating layer. Each of the first laminated body and the second laminated body has a structure in which at least four electrical conductor layers and at least three build-up insulating layers are alternately located. The electrical conductor layers include two types, that are a first electrical conductor layer and a second electrical conductor layer. In the electrical conductor layers in the first laminated body, at least a first outermost layer and a first innermost layer are the first electrical conductor layers, and a first intermediate layer located farther from the core insulating layer than the first innermost layer includes at least two or more of the second electrical conductor layers.

9 Claims, 3 Drawing Sheets

(56) References Cited

U.S. PATENT DOCUMENTS

2020/0315012 A1* 10/2020 Nakamura ........... H05K 3/4652

FOREIGN PATENT DOCUMENTS

| JP | 2016-127191 A | 7/2016 |
| WO | 2011/018938 A1 | 2/2011 |

* cited by examiner

WIRING BOARD

TECHNICAL FIELD

The present invention relates to a wiring board.

BACKGROUND ART

In a wiring board in which a build-up layer is formed on a surface of a core layer, as described in Patent Document 1, power supply electrical conductor layers and grounding electrical conductor layers included in the build-up layer are alternately arranged so as to face each other with an insulating layer interposed therebetween. By alternately arranging the power supply electrical conductor layers and the grounding electrical conductor layers in this way, inductance generated in the power supply electrical conductor layer and inductance generated in the grounding electrical conductor layer cancel out each other. As a result, inductance can be reduced in the wiring board. Furthermore, positions of pads for connecting electronic components, pads for connecting to a motherboard, and through holes formed in a core insulating layer can be easily adjusted.

CITATION LIST

Patent Literature

Patent Document 1: JP 2010-153520 A

SUMMARY

A wiring board according to the present disclosure includes a core insulating layer, a first laminated body located on an upper surface of the core insulating layer, and a second laminated body located on a lower surface of the core insulating layer. Each of the first laminated body and the second laminated body has a structure in which at least four electrical conductor layers and at least three build-up insulating layers are alternately located. The first laminated body includes a first mounting region for mounting electronic components. The electrical conductor layers include two types, that are a first electrical conductor layer and a second electrical conductor layer. In the electrical conductor layers in the first laminated body, at least a first outermost layer and a first innermost layer are the first electrical conductor layers, and a first intermediate layer located farther from the core insulating layer than the first innermost layer includes at least two or more of the second electrical conductor layers.

DESCRIPTION OF EMBODIMENTS

In order to exhibit the above-described effect, in a conventional wiring board, power supply electrical conductor layers and grounding electrical conductor layers included in the build-up layer are alternately arranged so as to face each other with an insulating layer interposed therebetween. Meanwhile, the build-up insulating layers may be formed to be thin in accordance with miniaturization of the wiring board. When the build-up insulating layers are thin, a short circuit is likely to occur between the power supply electrical conductor layer and the grounding electrical conductor layer facing each other with the insulating layer interposed therebetween.

As described above, in the wiring board according to the present disclosure, among the electrical conductor layers in the first laminated body, at least the first outermost layer and the first innermost layer are the first electrical conductor layers. The first intermediate layer located farther from the core insulating layer than the first innermost layer includes at least two or more of the second electrical conductor layers. That is, in the wiring board according to the present disclosure, a portion where the electrical conductor layers of the same type face each other with the build-up insulating layer interposed therebetween is present in the first intermediate layer, and thus the occurrence of the short circuit is reduced. Furthermore, a portion where the electrical conductor layers of different types face each other with the build-up insulating layer interposed therebetween is also present. Thus, it also contributes to the effect of reducing inductance and the ease of arrangement of the electrical conductor layers.

Figure 1:
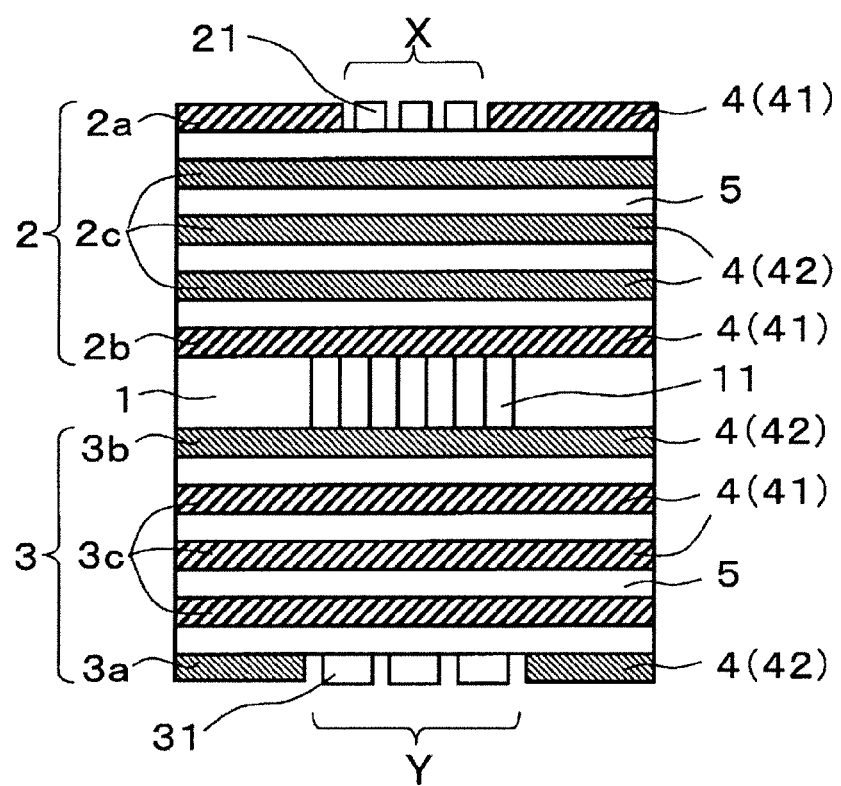
FIG. 1 is an explanatory view illustrating a main portion of a wiring board according to one embodiment of the present disclosure.

The wiring board according to an embodiment of the present disclosure will be described with reference to FIG. 1. FIG. 1 is an explanatory view illustrating a main portion according to one embodiment of the present disclosure. The wiring board according to one embodiment includes a core insulating layer 1, a first laminated body 2 located on an upper surface of the core insulating layer 1, and a second laminated body 3 located on a lower surface of the core insulating layer 1.

No particular limitation is applied to the core insulating layer 1, provided that it is made out of a material having an insulating property. Examples of the material having an insulating property include resins such as an epoxy resin, a bismaleimide-triazine resin, a polyimide resin, and a polyphenylene ether resin. Two or more of these resins may be mixed and used. The thickness of the core insulating layer 1 is not particularly limited and is, for example, 200 μm or more and 1500 μm or less.

The core insulating layer 1 may contain a reinforcing material. Examples of the reinforcing material include insulating fabric materials such as glass fiber, glass non-woven fabric, aramid non-woven fabric, aramid fiber, and polyester fiber. Two or more types of reinforcing materials may be used in combination. Further, inorganic insulating fillers made of, for example, silica, barium sulfate, talc, clay, glass, calcium carbonate, or titanium oxide may be dispersed in the core insulating layer 1.

Through hole conductors 11 are located in the core insulating layer 1 in order to electrically connect the upper and lower surfaces of the core insulating layer 1. Each of the through hole conductors 11 is located in a through hole penetrating the upper and lower surfaces of the core insulating layer 1. The through hole conductor 11 is formed of a metal plating conductor such as copper plating. The through hole conductor 11 is connected to the electrical conductor layers 4 located on both surfaces of the core insulating layer 1. The through hole conductor 11 may be formed only on the inner wall surface of the through hole or may be filled in the through hole. The core insulating layer 1 may include a circuit connected to the through hole conductor 11 inside the core insulating layer 1.

The first laminated body 2 located on the upper surface of the core insulating layer 1 has a structure in which the electrical conductor layers 4 and build-up insulating layers 5 are alternately laminated. An outermost layer of the first laminated body 2 includes a first mounting region X provided with first pads 21. The first pads 21 provided in the first mounting region X have relatively small diameters and are used, for example, for connecting electronic components. The electronic components are not limited as long as those are generally electronic components mounted on the wiring board. Examples of such electronic components include a semiconductor integrated circuit element, an optoelectronic element, and the like. The diameter of the first pad 21 is, for example, 35 μm or more and 180 μm or less, and a distance between the pads is 40 μm or more and 200 μm or less.

The electrical conductor layer 4 is formed, for example, of an electrical conductor made of copper foil or copper plating. There is no particular limitation applied to the thickness of the electrical conductor layer 4, and, for example, this thickness falls in a range of 1 μm or more and 20 μm or less. The electrical conductor layers 4 include first electrical conductor layers 41 and second electrical conductor layers 42. The first electrical conductor layers 41 and the second electrical conductor layers 42 are the electrical conductor layers of different types (electrical conductor layers having different electrical potentials), and such electrical conductor layers include a power supply electrical conductor layer and a grounding electrical conductor layer. For example, in a case where the first electrical conductor layers 41 are the power supply electrical conductor layers, the second electrical conductor layers 42 are the grounding electrical conductor layers. On the other hand, in a case where the first electrical conductor layers 41 are the grounding electrical conductor layers, the second electrical conductor layers 42 are the power supply electrical conductor layers. The electrical conductor layers 4 include a signal electrical conductor layer in addition to the above, but in FIGS. 1 to 3, for convenience of explanation, the arrangement relationship of the power supply electrical conductor layer and the grounding electrical conductor layer is simply illustrated.

The electrical conductor layers 4 are located so as to face each other with the build-up insulating layer 5 interposed therebetween. Four layers of the build-up insulating layer 5 are formed. As with the core insulating layer 1, the build-up insulating layers 5 are not particularly limited as long as the build-up insulating layers 5 are materials having an insulating property. Examples of the material having an insulating property include resins such as an epoxy resin, a bismaleimide-triazine resin, a polyimide resin, and a polyphenylene ether resin. Two or more of these resins may be mixed and used. The build-up insulating layers 5 may be formed of the same resin or different resins. The build-up insulating layers 5 and the core insulating layer 1 may be formed of the same resin or different resins.

Further, inorganic insulating fillers made of, for example, silica, barium sulfate, talc, clay, glass, calcium carbonate, or titanium oxide may be dispersed in the build-up insulating layers 5. The thickness of each of the build-up insulating layers 5 is not particularly limited and is, for example, 3 μm or more and 40 μm or less. The build-up insulating layers 5 may have the same thickness, or may have thicknesses different from each other.

Each of the build-up insulating layers 5 includes a via hole conductor (not illustrated) for electrically connecting the layers. The via hole conductor is located in a via hole penetrating the upper and lower surfaces of the build-up insulating layer 5. The via hole conductor is formed of a metal plating conductor such as copper plating, for example. The via hole conductor is connected to the electrical conductor layers 4 located on both surfaces of the build-up insulating layer 5. The via hole conductor may be filled in the via hole or may be formed only on the inner wall surface of the via hole.

In the wiring board according to one embodiment, among the layers forming the first laminated body 2, a first outermost layer 2a and a first innermost layer 2b are the first electrical conductor layers 41. A first intermediate layer 2c located farther from the core insulating layer 1 than the first innermost layer 2b includes at least two or more of the second electrical conductor layers 42. In other words, among the electrical conductor layers 4 in the first laminated body 2, in the first intermediate layer 2c between the first outermost layer 2a located closer to outermost side and the first innermost layer 2b located closer to innermost side, the two or more layers of the electrical conductor layer 4 closer to the side of the first innermost layer 2b are the second electrical conductor layers 42.

The second laminated body 3 located on the lower surface of the core insulating layer 1 has a structure in which the electrical conductor layers 4 and the build-up insulating layers 5 are alternately laminated. An outermost layer of the second laminated body 3 includes a second mounting region Y provided with second pads 31. Each of the second pads 31 provided in the second mounting region Y generally has a larger diameter than the first pad 21 provided in the first mounting region X, and is used for connecting to, for example, a mother board or the like. The electrical conductor layers 4 and the build-up insulating layers 5 are as described above, and detailed description thereof will be omitted. The diameter of the second pad 31 is, for example, 250 μm or more and 800 μm or less, and a distance between the pads is 300 μm or more and 1000 μm or less.

In the wiring board according to one embodiment, among the layers forming the second laminated body 3, a second outermost layer 3a and a second innermost layer 3b are the second electrical conductor layers 42. A second intermediate layer 3c located farther from the core insulating layer 1 than the second innermost layer 3b includes at least two or more of the first electrical conductor layers 41. In other words, among the electrical conductor layers 4 in the second laminated body 3, in the second intermediate layer 3a between the second outermost layer 3a located closer to outermost side and the second innermost layer 3b located closer to innermost side, the two or more layers of the electrical conductor layer 4 closer to the side of the second innermost layer 3b are the first electrical conductor layers 41. The arrangement of the electrical conductor layers 4 forming the second laminated body 3 is opposite to the arrangement of the electrical conductor layers 4 forming the first laminated body 2.

In this manner, the wiring board according to one embodiment includes: a portion in which the electrical conductor layers of the same type (second electrical conductor layers 42 illustrated in FIG. 1) are present with the build-up insulating layer 5 interposed therebetween in the first laminated body 2; and a portion in which the electrical conductor layers of the same type (first electrical conductor layers 41 illustrated in FIG. 1) are present with the build-up insulating layer 5 interposed therebetween in the second laminated body 3. Thus, for example, in a case where the thickness of the build-up insulating layer 5 is thin, the short circuit likely to occur between the electrical conductor layers 4 of different types is reduced. Furthermore, a portion where the electrical conductor layers 4 of different types face each other with the build-up insulating layer 5 interposed therebetween is also present. Thus, it also contributes to the effect of reducing inductance and the ease of arrangement of the wiring conductor. In particular, a portion in which the electrical conductor layers 4 of different types face with each other with the build-up insulating layer 5 of the outermost layer interposed therebetween in each of the first laminated body 2 and the second laminated body 3 is a portion near the electronic components, and thus the portion is advantageous to stably operate the electronic components due to the reduction in inductance. Furthermore, a portion in which the electrical conductor layers 4 of different types face with each other with the build-up insulating layer 5 of the innermost layer interposed therebetween in each of the first laminated body 2 and the second laminated body 3 is advantageous in terms of ease in arranging the electrical conductor layer 4 for connecting the first pad 21 and the second pad 31 with each other.

The wiring board as described above is formed, for example, as follows. First, the core insulating layer 1 is prepared. In the core insulating layer 1, the through holes are formed by performing drilling, blasting, or laser machining process on an insulating plate such as a double-sided copper-clad laminated body, and the electrical conductor layers 4 and the through hole conductors 11 are formed on a surface of the insulating plate and in the through holes, respectively, by a subtractive method. The electrical conductor layers 4 on the upper and lower surfaces of the core insulating layer 1 are electrically connected with each other by the through hole conductors 11.

Next, the build-up insulating layers 5 are formed on the upper and lower surfaces of the core insulating layer 1. The build-up insulating layers 5 are formed by applying thermosetting insulating resin films to the upper and lower surfaces of the core insulating layer 1 and thermosetting the films under vacuum.

Next, by performing the laser machining process on the build-up insulating layer 5, the via holes with the electrical conductor layer 4 as a bottom portion are formed. After the laser machining process, by performing desmear treatment for removing carbide or the like, adhesion strength between the via holes and the via hole conductors improves.

Next, by the semi-additive method, the electrical conductor layers 4 and the via hole conductors are formed, respectively, on surfaces of the build-up insulating layers 5 and in the via holes, with the copper plating metal. The electrical conductor layer 4 on the surface of the build-up insulating layer 5 and the electrical conductor layer 4 at the bottom of the via holes are electrically connected with each other by the via hole conductors.

By repeating the forming step of the build-up insulating layers 5 and the forming step of the electrical conductor layers 4, a predetermined number of layers of the build-up insulating layers 5 can be formed. Thus, the first laminated body 2 and the second laminated body 3 are formed, respectively, on the upper surface and the lower surface of the core insulating layer 1. The first pad 21 and the second pad 31 are formed, respectively, on the upper surface of the first laminated body 2 and the lower surface of the second laminated body 3, by the same method as that for the electrical conductor layer 4. In this way, the wiring board as illustrated in FIG. 1 is formed.

Next, a wiring board according to another embodiment of the present disclosure will be described with reference to FIG. 2. In the wiring board according to another embodiment illustrated in FIG. 2, the same reference numerals are attached to the same members as those of the wiring board according to the embodiment illustrated in FIG. 1, and detailed explanation of the members is omitted.

Figure 2:
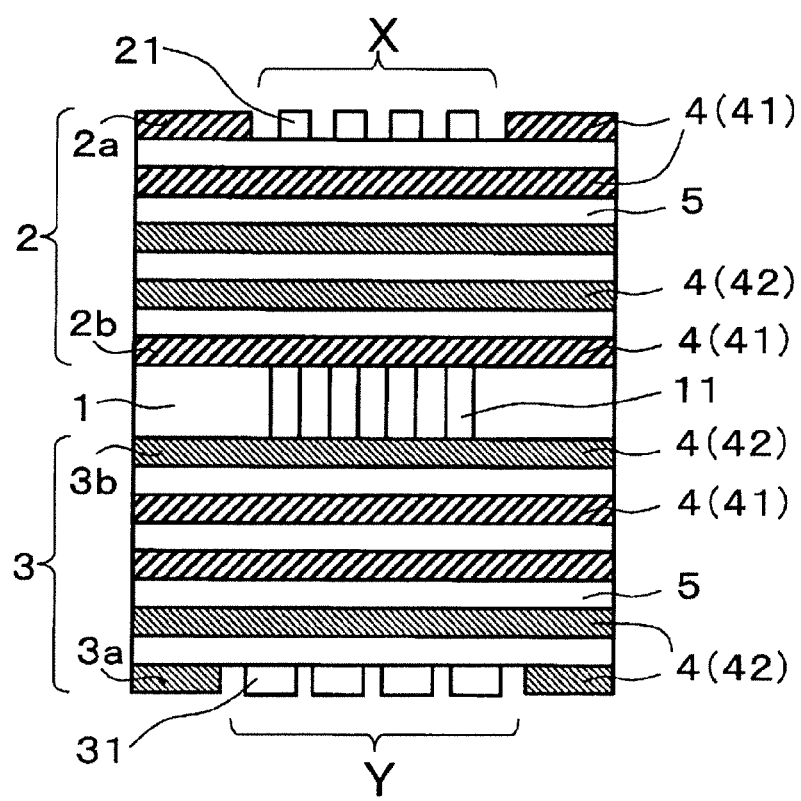
FIG. 2 is an explanatory view illustrating a main portion of a wiring board according to another embodiment of the present disclosure.

In the wiring board according to another embodiment illustrated in FIG. 2, among the electrical conductor layers 4 in the first laminated body 2, the first electrical conductor layer 41 is also located one layer inside the first outermost layer 2a in addition to the first outermost layer 2a and the first innermost layer 2b. Similarly, among the electrical conductor layers 4 in the second laminated body 3, the second electrical conductor layer 42 is also located one layer inside the second outermost layer 3a in addition to the second outermost layer 3a and the second innermost layer 3b.

In the wiring board of the present disclosure, among the electrical conductor layers 4 in the first laminated body 2, the first electrical conductor layer 41 may be located at least at the first outermost layer 2a and the first innermost layer 2b. Thus, as illustrated in FIG. 1, the first electrical conductor layers 41 may be located only at the first outermost layer 2a and the first innermost layer 2b, and as illustrated in FIG. 2, the first electrical conductor layer 41 may also be located one layer inside the first outermost layer 2a in addition to the first outermost layer 2a and the first innermost layer 2b.

Similarly, in the wiring board of the present disclosure, among the electrical conductor layers 4 in the second laminated body 3, the second electrical conductor layer 42 may be located at least at the second outermost layer 3a and at the second innermost layer 3b. Thus, as illustrated in FIG. 1, the second electrical conductor layers 42 may be located only at the second outermost layer 3a and the second innermost layer 3b, and as illustrated in FIG. 2, the second electrical conductor layer 42 may also be located one layer inside the second electrical conductor layer 3a in addition to the second outermost layer 3a and the second innermost layer 3b.

The wiring board according to another embodiment as illustrated in FIG. 2 is employed, for example, in a case where an area of the electrical conductor layer 4 for a predetermined application cannot be sufficiently secured. For example, the first pads 21 and the second pads 31 (each includes power supply pads, grounding pads, and signal pads) are located in the first outermost layer 2a of the first laminated body 2 and the second outermost layer 3a of the second laminated body 3, respectively. Thus, when areas where these pads are located is wide, arrangement areas of the electrical conductor layers 4 located in the first outermost layer 2a and the second outermost layer 3a cannot be sufficiently secured. At this time, for example, in a case where the first outermost layer 2a and the second outermost layer 3a are the first electrical conductor layers 41, and the one layer inside layers are the second electrical conductor layers 42, the facing area of the first electrical conductor layer 41 and the second electrical conductor layer 42 cannot be sufficiently secured, and thus the effect of reducing the inductance may be insufficient. Thus, for example, in the first laminated body 2, the electrical conductor layer 4 located one layer inside the first outermost layer 2a is also the first electrical conductor layer 41, thus securing the area facing the second electrical conductor layer 42 and reducing inductance. That is, in the first laminated body 2 and the second laminated body 3, the electrical conductor layers 4 located one layer inside the first outermost layer 2a and the second outermost layer 3a are also the electrical conductor layers 4 of the same type as the first outermost layer 2a and the second outermost layer 3a, thus securing an area facing electrical conductor layers 4 of the different types and reducing inductance.

The wiring board according to another embodiment as illustrated in FIG. 2 is employed, for example, in a case where a large number of pads as described above are arranged, and a case where the areas of the electrical conductor layers 4 located at the first outermost layer 2a and the second outermost layer 3a can be secured to be only 50% or less of the areas of the electrical conductor layers 4 (the electrical conductor layers of the different types) located one layer inside the first outermost layer 2a and the second outermost layer 3a.

Figure 3:
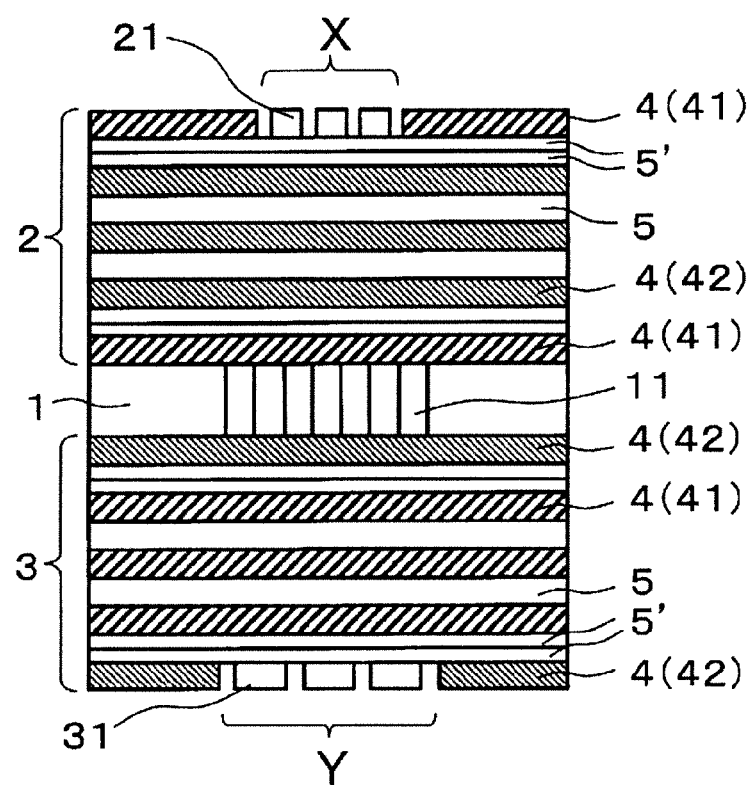
FIG. 3 is an explanatory view illustrating a main portion of a wiring board according to yet another embodiment of the present disclosure.

Next, a wiring board according to yet another embodiment of the present disclosure will be described with reference to FIG. 3. In the wiring board according to yet another embodiment illustrated in FIG. 3, the same reference numerals are attached to the same members as those of the wiring board according to the embodiment illustrated in FIG. 1, and detailed explanation of the members is omitted.

In the wiring board according to yet another embodiment, a build-up insulating layer 5' present between the first electrical conductor layer 41 and the second electrical conductor layer 42 has a two-layer structure. As described above, in the case where the electrical conductor layers 4 of different types face each other with the build-up insulating layer 5 interposed therebetween, the short circuit may occur between the electrical conductor layers 4 of different types. Such a short circuit is likely to occur when impurities are mixed in the build-up insulating layer 5.

Impurities mixed in the build-up insulating layer may be located over the upper surface and the lower surface of the build-up insulating layer. In this case, in a case where the electrical conductor layers 4 of the different types are present on the upper surface and the lower surface of the build-up insulating layer 5, the short circuit is likely to occur between the electrical conductor layers 4 via impurities. On the other hand, in a case of having the two-layer structure as the build-up insulating layer 5', even when the impurities are mixed in each insulating layer, the probability that the impurities mixed in each insulating layer overlap each other is low, and thus the state in which the impurities are located from the upper surface to the lower surface of the build-up insulating layer 5' can be reduced. As a result, the occurrence of the short circuit between the electrical conductor layers 4 of the different types is further reduced.

The wiring board of the present disclosure is not limited to the above-described embodiments. Although not illustrated in FIGS. 1 to 3, a solder resist may be formed on a part of both surfaces in the wiring board of the present disclosure. In a case where the wiring board includes the solder resist, it is advantageous in that the electrical conductor layer 4 can be protected from heat when the electronic components are mounted.

A plurality of the power supply electrical conductor layers having different paths may present in the wiring board. In this case, the above structure is at least applied to a case where a plane area of the power supply electrical conductor layer occupies 25% or more of a plane area of the core insulating layer 1. That is, by applying the structure of the present disclosure to the power supply electrical conductor layer having a large area for supplying a large current to the electronic components, it is particularly advantageous to reduce the short circuit between the electrical conductor layers. The plane area of such a power supply electrical conductor layer occupies 25% or more of the plane area of the core insulating layer 1 in at least one layer of each layer in the same path. An area occupancy ratio of such a power supply electrical conductor layer can be confirmed by, for example, planar polishing the wiring board to expose the electrical conductor layer 4.

Furthermore, in the wiring board according to the above-described embodiment, the electrical conductor layers 4 and the build-up insulating layers 5 are laminated in the same number of layers in both the first laminated body 2 and the second laminated body 3. However, in the wiring board of the present disclosure, the first laminated body 2 and the second laminated body 3 are not limited as long as each has a structure in which at least four electrical conductor layers 4 and at least three build-up insulating layers 5 are alternately laminated, and the first laminated body 2 and the second laminated body 3 may include different numbers of layers.

In the wiring board according to the above-described embodiment, the case in which the layers of the electrical conductor layers 4 of the same type facing with each other are included in both the first laminated body 2 and the second laminated body 3 is illustrated, but the layers of the electrical conductor layers 4 of the same type facing with each other may be included only in one of the first laminated body 2 and the second laminated body 3 in consideration of the ease of the wiring line, electrical characteristics, and the like.

REFERENCE SIGNS LIST

1 Core insulating layer
2 First laminated body
2a First outermost layer
2b First innermost layer
2c First intermediate layer
3 Second laminated body
3a Second outermost layer
3b Second innermost layer
3c Second intermediate layer
4 Electrical conductor layer
41 First electrical conductor layer
42 Second electrical conductor layer
5 Build-up insulating layer
X First mounting region
Y Second mounting region

The invention claimed is:
1. A wiring board comprising:
a core insulating layer;
a first laminated body located on an upper surface of the core insulating layer; and
a second laminated body located on a lower surface of the core insulating layer, wherein
each of the first laminated body and the second laminated body has a structure in which at least four electrical conductor layers and at least three build-up insulating layers are alternately located,
the first laminated body comprises a first mounting region configured to mount electronic components,
the electrical conductor layers comprise at least two types being a first electrical conductor layer having a first electrical potential and a second electrical conductor layer having a second electrical potential that is different than the first electrical potential, and in the electrical conductor layers in the first laminated body:
   at least a first outermost layer and a first innermost layer are the first electrical conductor layers, and
   a first intermediate layer located farther from the core insulating layer than the first innermost layer comprises at least two or more of the second electrical conductor layers having the second electrical potential and disposed consecutively with a build-up insulating layer between consecutive second conductor layers.

2. The wiring board according to claim 1, wherein
in the electrical conductor layers in the second laminated body, at least a second outermost layer and a second innermost layer are the second electrical conductor layers, and
a second intermediate layer located farther from the core insulating layer than the second innermost layer comprises two or more of the first electrical conductor layers.

3. The wiring board according to claim 1, wherein
the first electrical conductor layer is a grounding electrical conductor layer, and
the second electrical conductor layer is a power supply electrical conductor layer.

4. The wiring board according to claim 1, wherein
the first electrical conductor layer is a power supply electrical conductor layer, and
the second electrical conductor layer is a grounding electrical conductor layer.

5. The wiring board according to claim 1, wherein
in the first laminated body, a layer of one layer inside the first outermost layer is the first electrical conductor layer.

6. The wiring board according to claim 1, wherein
in the second laminated body, a layer of one layer inside a second outermost layer is the second electrical conductor layer.

7. The wiring board according to claim 3, wherein
the power supply electrical conductor layer has a plane area occupying 25% or more of a plane area of the core insulating layer in at least one layer.

8. The wiring board according to claim 1, wherein
the second laminated body comprises a second mounting region configured to mount the electronic components.

9. The wiring board according to claim 1, wherein
the build-up insulating layer located between the first electrical conductor layer and the second electrical conductor layer has a two-layer structure.

* * * * *